United States Patent
Cusmariu

(10) Patent No.: US 7,715,996 B1
(45) Date of Patent: May 11, 2010

(54) METHOD OF ESTIMATING DIGITAL SIGNAL FREQUENCY

(75) Inventor: Adolf Cusmariu, Eldersburg, MD (US)

(73) Assignee: The United States of America as represented by the Director of the National Security Agency, Washington, DC (US)

( * ) Notice: Subject to any disclaimer, the term of this patent is extended or adjusted under 35 U.S.C. 154(b) by 272 days.

(21) Appl. No.: 11/904,538

(22) Filed: Sep. 27, 2007

(51) Int. Cl.
*G01R 23/16* (2006.01)
*G06F 11/30* (2006.01)

(52) U.S. Cl. .......................... 702/76; 702/77; 702/182; 702/188

(58) Field of Classification Search ............. 702/76–78, 702/182–199
See application file for complete search history.

(56) References Cited

U.S. PATENT DOCUMENTS

| 4,904,930 A | 2/1990 | Nicholas | | |
|---|---|---|---|---|
| 5,729,124 A | * 3/1998 | Lu | ........................ | 324/76.24 |
| 6,266,013 B1 | * 7/2001 | Stilp et al. | .................. | 342/387 |
| 6,577,968 B2 | 6/2003 | Nelson | | |

* cited by examiner

*Primary Examiner*—Eliseo Ramos Feliciano
*Assistant Examiner*—Phuong Huynh
(74) *Attorney, Agent, or Firm*—Eric Froehlich; Robert D. Morelli

(57) ABSTRACT

The present invention is a novel method of performing spectral analysis on a digital signal. The received signal is segmented into a number of data blocks, which may be disjoint or overlapping. For each data block, the signal is differentiated, and the Gram-Schmidt process is used to obtain orthogonality between a signal and its derivative. The complex extension leads to computation of phase using either the inverse tangent function or the complex logarithm. Finally, frequency estimation follows through differentiation of the unwrapped phase.

14 Claims, 2 Drawing Sheets

METHOD OF ESTIMATING DIGITAL SIGNAL FREQUENCY

FIELD OF THE INVENTION

The present invention relates, in general, to measuring a signal, and, in particular to waveform analysis of frequency.

BACKGROUND OF THE INVENTION

Frequency estimation is the cornerstone of digital signal processing, whether for analysis of radar, sonar, speech, or telephony signals. The Fourier transform, embodied in the modern FFT algorithm, has been the leading method of frequency estimation both in hardware and software. Twenty years before the advent of the FFT, Gabor introduced the notion of Instantaneous Frequency (IF) for a signal, which is derived from a complex extension using the Hilbert transform. The critical property that allowed such a different approach is the orthogonality of any signal to its Hilbert transform; Gabor's IF notion applied ideas from classical complex analysis.

The Fourier transform suffers from the well-known localization constraint, an inability to resolve time and frequency equally well, while the Hilbert transform is an infinite impulse response (IIR) filter, hence realizable digitally only approximately.

Typical of prior art methods employing the Fourier transform to estimate frequency include:

U.S. Pat. No. 4,904,930, entitled "ESTIMATION OF CARRIER FREQUENCY ESTIMATION," U.S. Pat. No. 5,729,124, entitled "ESTIMATION OF SIGNAL FREQUENCY USING FAST WALSH TRANSFORM," and U.S. Pat. No. 6,577,968 entitled "METHOD OF ESTIMATING SIGNAL FREQUENCY," each disclose a method of estimating frequency using the either a Fourier transform or a Walsh-Hadamard transform, a generalized class of Fourier transforms. The present invention does not use Fourier or Walsh transforms, as do the methods described in U.S. Pat. Nos. 4,904,930, 5,729,124, and 6,577,968. U.S. Pat. Nos. 4,904,930, 5,729,124, and 6,577,968 are hereby incorporated by reference into the specification of the present invention.

There exists a need to estimate frequency of a signal in a less computationally complicated manner.

SUMMARY OF THE INVENTION

It is an object of the present invention to estimate the frequency of a received signal in a less computationally complicated manner. The method uses a differentiation operation to generate a complex extension of a real signal, and then produce an estimate of frequency from the phase of the resulting complex extension.

The present invention estimates digital signal frequency without the use of Hilbert or Fourier transforms common in prior art methods.

The first step of the present method is receiving a signal.

The second step of the present method is digitizing the received signal.

The third step of the present method is segmenting the digitized signal into one or more data blocks.

The fourth step of the present method is selecting one of the data blocks.

The fifth step of the present method is to differentiate the data block selected in the fourth step.

The sixth step of the present method is calculating the orthogonal of the differentiated data block of the fifth step to the data block selected in the fourth step.

The seventh step of the present method is computing the phase using the data block selected in the fourth step and the result of the sixth step.

The eighth step of the present method is unwrapping the phase from the seventh step.

The ninth step of the present method is differentiating the phase determined in the eighth step to estimate frequency.

The tenth, and final, step of the present method is repeating the fourth step through the ninth step for each data block the signal was divided into in the third step.

DETAILED DESCRIPTION OF THE INVENTION

The present invention is a method of estimating digital signal frequency without the use of Fourier or Hilbert transforms. The invention replaces the Hilbert transform by the much simpler differentiation operation, and orthogonality is established using the Gram-Schmidt process.

Figure 1:
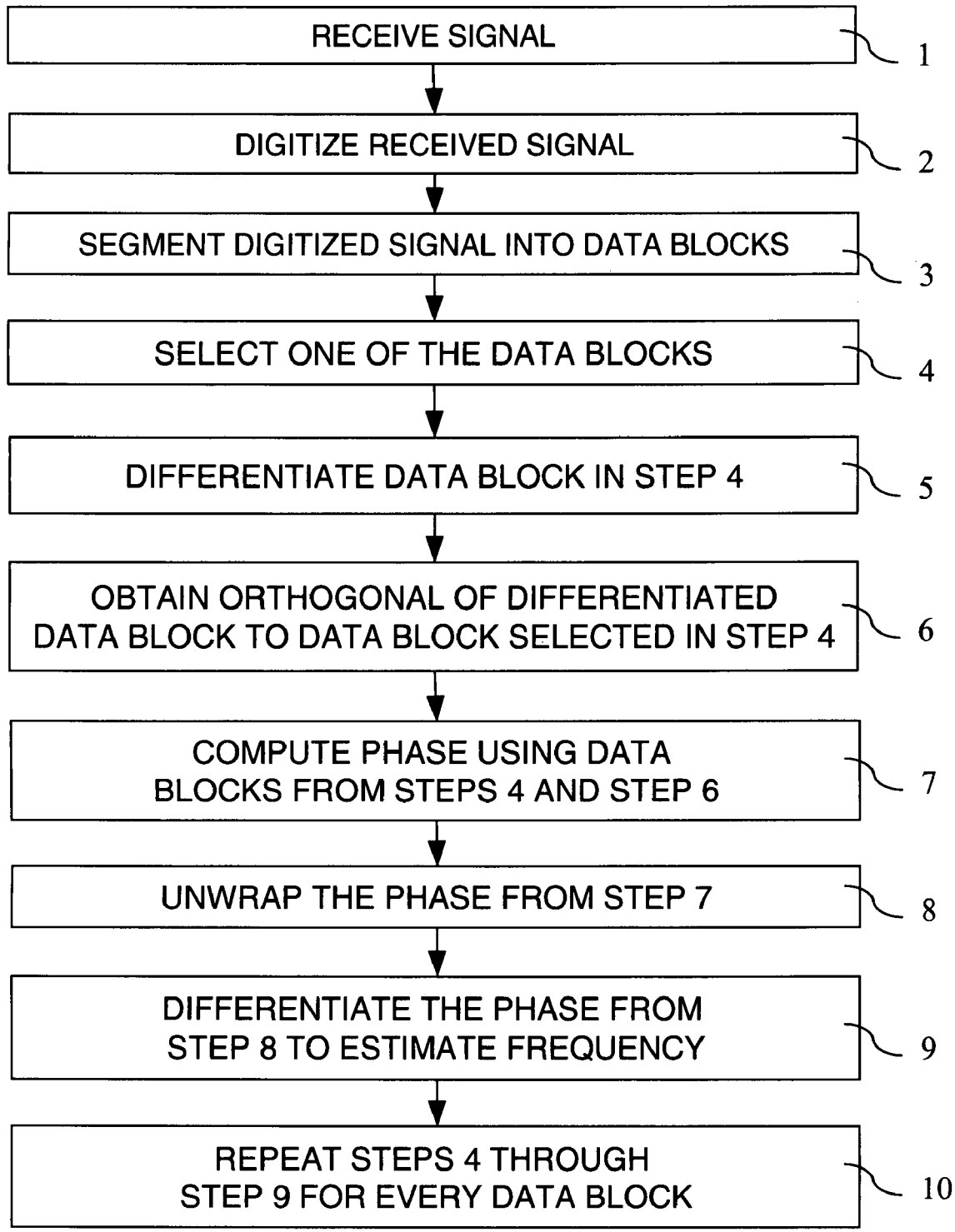
FIG. 1 is a flowchart of steps of the present invention.

A flowchart of the steps of the present invention is shown in FIG. 1.

The first step 1 of the present method is receiving a signal.

The second step 2 of the present method is digitizing the received signal.

The third step 3 of the present method is segmenting the digitized signal into one or more data blocks.

The number of data blocks is user-selectable and may be either overlapping blocks or disjointed.

Data segmentation may be performed using disjoint or overlapping increments defined by a user-selected number of samples. Tapering may also be applied to data segments using any of the known window tapers, such as triangular, trapezoidal, Gaussian, Hamming, Hanning, Kaiser, and so on.

The fourth step 4 of the present method is selecting one of the data blocks.

The fifth step 5 of the present method is to differentiate the data block selected in the fourth step. Differentiation means to use the next-sample numerical difference or to use higher order numerical differences.

The sixth step 6 of the present method is calculating the orthogonal of the differentiated data block of the fifth step 5 to the data block selected in the fourth step 4.

The Gram-Schmidt process is used to obtain the required orthogonality between a signal and its derivative. The complex extension then leads to computation of phase using either the inverse tangent function or the complex logarithm.

To use the Gram-Schmidt process, the following steps are preferably used:

First, compute the vector dot product of data from the fourth step 4 of the present method with itself.

Second, compute the vector dot product of data from the fourth step 4 of the present method with data from the fifth step 5 of the present method.

Third, divide the result of the second step in the Gram-Schmidt process above by the first step in the Gram-Schmidt process above.

Fourth, multiply result in the third step of the Gram-Schmidt process above by digital data from the fourth step 4 of the present method.

Fifth, subtract result of the fourth step of the Gram-Schmidt process above from the data in the fifth step 5 of the present method.

The result of the fifth step of the Gram-Schmidt process above will be orthogonal to data in Step 4 of the present method, and comprises the sixth step 6 of the present method.

The seventh step 7 of the present method is computing the phase using the data block selected in the fourth step 4 and the result of the sixth step 6.

The complex extension leads to computation of phase using either the inverse tangent function or the complex logarithm.

Thus, the phase angle between the data from the fourth step 4 of the present method and the sixth step 6 may be computed from the arctangent (or inverse tangent) of data from the sixth step 6 divided by data from the fourth step 4; or by following the following steps:

First, multiply data in the sixth step 6 of the present method by the imaginary unit i (square root of minus one).

Second, add the result of the first step above to the result of the fourth step 4 of the present method.

Third, compute the complex logarithm of the result of the second step above.

Fourth, take the imaginary part of the third step above, yielding the wrapped phase.

The eighth step 8 of the present method is unwrapping the phase from the seventh step 7.

Persons skilled in the art will recognize that phase unwrapping refers to the process of contiguously joining phase segments as soon as they exceed 2*Pi radians.

The ninth step 9 of the present method is differentiating the phase determined in the eighth step 8 to estimate frequency.

Differentiation the phase means next-sample numerical difference. In an alternate embodiment, the data is smoothed through averaging.

To improve the quality of frequency estimation over segmented digital data, linear regression may first be applied to the unwrapped phase; the coefficient of the $1^{st}$ order term is then the estimated frequency over the chosen segment. Linear regression also provides a measure of frequency accuracy, not available through Fourier or Hilbert transform based methods.

Figure 2:
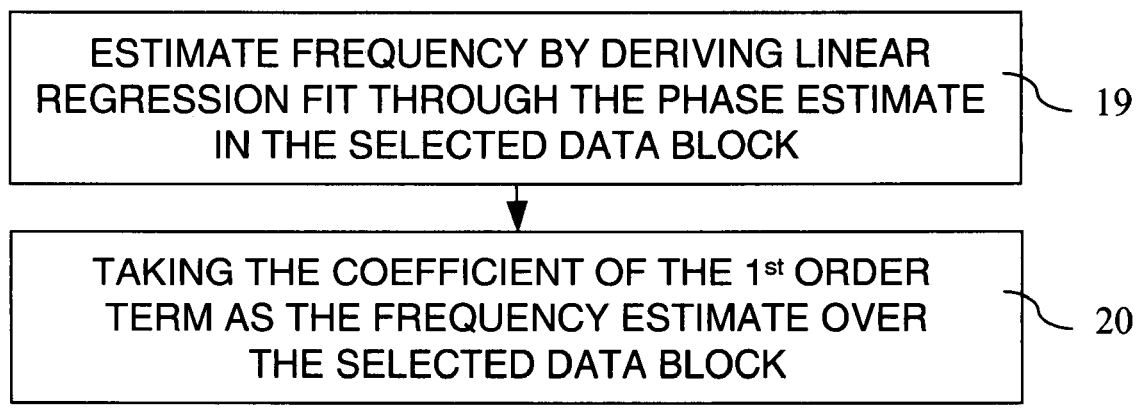
FIG. 2 is a flowchart of the steps of an alternate embodiment.

Therefore, in another alternate embodiment shown in FIG. 2, the ninth step 9 in the preferred embodiment is replaced with the following variant (steps 1-8 are the same as the preferred embodiment described above).

First in step 19, a linear regression fit through the phase estimate in the selected data block is derived.

Second in step 20, the coefficient of the $1^{st}$ order term is used as the frequency estimate over the selected block.

As noted above, this alternate embodiment has two advantages: it allows one to obtain a more robust estimate of frequency from phase; and linear regression provides an estimate of frequency accuracy.

Higher order derivatives may also be used in generating the complex extension of the real signal.

Referring again to FIG. 1, the tenth, and final, step 10 of the present method is repeating the fourth step 4 through the ninth step 9 for each data block the signal was divided into in the third step 3.

The present invention presents a number of benefits over prior art techniques. All operations are in the time domain, and no filtering is involved.

While the preferred embodiments of the invention have been illustrated and described, it will be apparent to those of ordinary skill in the art that various changes and modifications may be made without deviating from the inventive concepts set forth above.

What is claimed is:

1. A method of estimating digital signal frequency, comprising the steps of:
   a) receiving on a computing device a signal;
   b) digitizing on the computing device the received signal;
   c) segmenting on the computing device the digitized signal into at least one data block;
   d) selecting on the computing device one of the data blocks;
   e) differentiating on the computing device the data block selected in step (d);
   f) calculating on the computing device the orthogonal of the differentiated data block of step (e) to the data block selected in step (d), comprising the steps of:
      i) computing on the computing device the vector dot product of data from step (d) with itself;
      ii) computing on the computing device the vector dot product of data from step (d) with data from step (e);
      iii) dividing on the computing device the result of step (ii) by step (i);
      iv) multiplying on the computing device result in step (iii) by the digital data from step (d); and
      v) subtracting on the computing device result of step (iv) from the data in step (e);
   g) computing on the computing device the phase, comprising the steps of:
      i) computing an arctangent of the data of step (f); and
      ii) dividing the arctangent by the result of step (d);
   h) unwrapping on the computing device the phase from the step (g) by joining segments of the phase as the exceed $2\pi$ radians;
   i) differentiating on the computing device the phase determined in step (h) to estimate frequency; and
   j) returning to step (d) if a data block has not been selected.

2. The method of claim 1, wherein segmentation comprises at least two data blocks.

3. The method of claim 2, wherein the at least two data blocks are user-selectable comprising the received signal in one of disjointed and overlapping data blocks.

4. The method of claim 3, wherein the user-selectable data blocks comprising the received signal in one of disjointed or overlapping data blocks are tapered using a user-selectable window taper.

5. The method of claim 4, wherein the user-selectable window tapers are selected from the group of user-selectable window tapers consisting of triangular, trapezoidal, Gaussian, Hamming, Hanning, Kaiser, and any equivalent user-selectable window taper.

6. The method of claim 1, wherein the step of computing on the computing device the phase comprises:
   i) multiplying on the computing device data resulting from step (f) by the square root of minus one;
   ii) adding on the computing device the result of step (i) to the result in step (d);
   iii) computing on the computing device complex logarithm of the result of step (ii); and
   iv) identifying the imaginary part of step (iii) as the wrapped phase.

7. The method of claim 1, wherein the step of differentiating on the computing device the phase determined in step (h) to estimate frequency is comprised of computing a next-sample numerical difference.

8. The method of claim 7, further comprising smoothing the result by averaging the data.

9. A method of estimating digital signal frequency, comprising the steps of:
- a) receiving on a computing device a signal;
- b) digitizing on the computing device the received signal;
- c) segmenting on the computing device the digitized signal into at least one data blocks;
- d) selecting on the computing device one of the data blocks;
- e) differentiating on the computing device the data block selected in step (d);
- f) calculating on the computing device the orthogonal of the differentiated data block of step (e) to the data block selected in step (d), comprising the steps of:
  - i) computing on the computer device the vector dot product of data from step (d) with itself;
  - ii) computing on the computing device the vector dot product of data from step (d) with data from step (e);
  - iii) dividing on the computing device the result of step an (ii) by the result of step (i);
  - iv) multiplying on the computing device result in step (iii) by the digital data from step (d); and
  - v) subtracting on the computing device result of step (iv) from the data in step (e);
- g) computing on the computing device the phase comprising the steps of:
  - i) computing an arctangent of the data of step (f); and
  - ii) dividing the arctangent by the result of step (d);
- h) unwrapping on the computing device the phase from step (g) by joining segments of the phase as they exceed $2\pi$ radians;
- i) estimating on the computing device the frequency from the unwrapped phase in step (h) by deriving the linear regression fit through the phase estimate in the data block selected in step (d), and taking the coefficient of the $1^{st}$ order term as the frequency estimate over the selected data block; and
- j) returning to step (d) is a data block has not been selected.

10. The method of claim 9, wherein the at least one data blocks comprise at least two data blocks.

11. The method of claim 10, wherein the at least two data blocks are user-selectable comprising the received signal in one of disjointed and overlapping data blocks.

12. The method of claim 11, wherein the user-selectable data blocks comprising the received signal in one of disjointed or overlapping data blocks are tapered using a user-selectable window taper.

13. The method of claim 12, wherein the user-selectable window tapers are selected from the group of user-selectable window tapers consisting of triangular, trapezoidal, Gaussian, Hamming, Hanning, Kaiser, and any equivalent user-selectable window taper.

14. The method of claim 9, wherein the step of computing on the computing device the phase comprises:
- i) multiplying data resulting from step (f) by the square root of minus one;
- ii) adding the result of step (i) to the result in step (d);
- iii) computing complex logarithm of the result of step (ii); and
- iv) identifying the imaginary part of step (iii) as the wrapped phase.

* * * * *